United States Patent
Kuromiya et al.

(10) Patent No.: US 8,853,523 B2
(45) Date of Patent: Oct. 7, 2014

(54) SOLAR CELL MODULE AND MANUFACTURING METHOD OF THE SAME

(71) Applicant: Panasonic Corporation, Kadoma (JP)

(72) Inventors: Michiru Kuromiya, Osaka (JP); Shuzo Tsuchida, Nara (JP); Tomohiro Okumura, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/868,627

(22) Filed: Apr. 23, 2013

(65) Prior Publication Data

US 2013/0306134 A1 Nov. 21, 2013

(30) Foreign Application Priority Data

May 15, 2012 (JP) .................. 2012-111076

(51) Int. Cl.
*H01L 31/0216* (2014.01)
*H01L 31/0236* (2006.01)

(52) U.S. Cl.
CPC .......... *H01L 31/02168* (2013.01); *Y02E 10/52* (2013.01); *H01L 31/02366* (2013.01)
USPC .............................. 136/246; 136/244; 438/72

(58) Field of Classification Search
USPC ...................... 136/246, 244; 438/72
See application file for complete search history.

(56) References Cited

U.S. PATENT DOCUMENTS

| | | | |
|---|---|---|---|
| 2002/0162585 | A1 | 11/2002 | Sugawara et al. |
| 2012/0145222 | A1 | 6/2012 | Chen |
| 2012/0211054 | A1 | 8/2012 | Suga |
| 2012/0266950 | A1 | 10/2012 | Lee |

FOREIGN PATENT DOCUMENTS

| | | |
|---|---|---|
| JP | 2002-161262 | 6/2002 |
| JP | 2002-299659 | 10/2002 |
| JP | 2003-152202 | 5/2003 |
| JP | 2003-201443 | 7/2003 |
| JP | 2011-009468 | 1/2011 |
| JP | 2011-029273 | 2/2011 |
| JP | 2012-532444 | 12/2012 |
| WO | WO 2011/055446 | 5/2011 |

*Primary Examiner* — Golam Mowla

(74) *Attorney, Agent, or Firm* — Hamre, Schumann, Mueller & Larson, P.C.

(57) ABSTRACT

A solar cell module includes an antireflective film (4) which has a curved shape depressed towards a side to place photovoltaic cells (1) so as to make a film thickness of the antireflective film (4) in boundary regions (E2) between regions (E1) immediately above the adjacent photovoltaic cells (1) smaller than a film thickness of the antireflective film (4) in the regions (E1) immediately above the photovoltaic cells (1).

2 Claims, 4 Drawing Sheets

SOLAR CELL MODULE AND MANUFACTURING METHOD OF THE SAME

FIELD OF THE INVENTION

The present invention relates to a solar cell module provided with a plurality of photovoltaic cells and a method of manufacturing a solar cell module, and relates more specifically to an antireflective film.

BACKGROUND OF THE INVENTION

In recent years, solar cells have been greatly interested as a clean energy source, and in particular, silicon solar cells that are highly efficient in power generation have been actively researched for improvement in conversion efficiency and cost reduction as the most promising candidate for power supply targeting the high end market, such as housing.

In such a situation, in order to improve the conversion efficiency by transmitting more sunlight, a method is known in which an antireflective film having a uniform film thickness on the entire surface of a transparent member of a solar cell module is formed to reduce the reflectance utilizing a difference in the refractive index from the transparent member.

As one of the methods of forming such film, a method of forming a metal oxide, called as a sol-gel method, is proposed in which metal alkoxide and an organic solvent are mixed and hydrolysis is carried out as follows using water and a catalyst

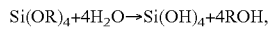
$$Si(OR)_4 + 4H_2O \rightarrow Si(OH)_4 + 4ROH,$$

thereby producing a hydroxide to condense the reactants as follows (for example, refer to Japanese Patent Laid-Open No. 2003-201443)

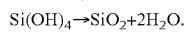
$$Si(OH)_4 \rightarrow SiO_2 + 2H_2O.$$

An antireflective film formed by the sol-gel method is a porous material having silica particles and a matrix retaining the silica particles. Voids in the film have a refractive index substantially the same as that of an air (refractive index of 1.0), so that even when the microparticle material and the matrix retaining the particles have a large refractive index, the entire film has a refractive index close to that of an air as a result. Accordingly, forming the film on a transparent member enables to reduce the reflectance.

A solar cell module has a plurality of photovoltaic cells that are connected electrically and are placed at predetermined intervals from each other. Incident light in each photovoltaic cell contributes to the conversion efficiency by conversion to electricity while incident light in a clearance between the photovoltaic cells is not converted to electricity and does not contribute to the conversion efficiency. Accordingly, it is essential, for improvement in conversion efficiency, to efficiently introduce incident light from a light receiving surface of a solar cell module to each photovoltaic cell, not to a clearance between the photovoltaic cells.

As a method of solving the above problems, shown in FIGS. 5 and 6 are examples of, not forming the antireflective film 4 having a predetermined film thickness on the entire surface of a transparent member 5 of a solar cell module, but forming an antireflective film 4 having a predetermined film thickness only in a region immediately above each photovoltaic cell 1 and reducing the film thickness of the antireflective film 4 in the regions other than the regions immediately above the photovoltaic cells 1 thinner than that in the regions immediately above the photovoltaic cells 1 (refer to FIG. 5) or to zero (refer to FIG. 6), as disclosed in Japanese Patent Laid-Open No. 2003-152202.

DISCLOSURE OF THE INVENTION

As disclosed in Japanese Patent Laid-Open No. 2003-152202, an antireflective film having a predetermined film thickness is formed only on a transparent member in the region immediately above each photovoltaic cell and the film thickness of the antireflective film is reduced on the transparent member in the regions other than the regions immediately above the photovoltaic cells thinner than that in the regions immediately above the cells (refer to FIG. 5) or to zero (refer to FIG. 6). Thus, it is possible to efficiently capture incident light from regions surrounding the regions immediately above the photovoltaic cells, to increase the incident light in the photovoltaic cells, and to improve the conversion efficiency.

However, in the above antireflective film, end portions of the region immediately above each photovoltaic cell have a vertical shape, so that oblique light from a region surrounding the region immediately above each photovoltaic cell is prone to be reflected on the antireflective film surface depending on the angle of incidence, and thus loss of light reception increases.

Further, as a method of forming the antireflective film, there is a method in which, after a region of glass immediately above each photovoltaic cell is masked by a resin film or the like, a single layer or multilayer of antireflective film is applied on the masked glass surface using dipping, screen printing, or the like. Then, the masking resin film is dried and fired for removal. However, according to the method, an increase in costs is inevitable due to costs of masking materials and increasing complexity of manufacturing process.

Furthermore, stress is applied to the antireflective film when the masking film is taken off, which decreases the adhesion between the glass and the antireflective film and/or develops microcracks in the antireflective film. Thus $H_2O$ and $CO_2$ in the atmosphere reach a surface of the transparent member through a narrow gap between the glass and the antireflective film and/or the microcracks. Further, the $H_2O$ and $CO_2$ react with alkali ions diffused on the surface of the transparent member to bring about production of crystals on the surface of the transparent member and melting of the surface of the transparent member. As a result, the transmittance of the antireflective film after long term storage decreases.

It is also possible to form the antireflective film using a selective etching or vapor deposition method by sputtering for forming a thin film of metal oxide, while an increase in costs of manufacturing process is inevitable in comparison with thick film forming process.

In view of the above conventional problems, it is an object of the present invention to provide a solar cell module that is highly efficient, low in cost, and also is high in long term reliability. Further, it is an object to provide a method of manufacturing the solar cell module.

A solar cell module according to the present invention is a solar cell module including: a plurality of photovoltaic cells electrically connected by connectors; and an antireflective film on a light receiving surface side of the photovoltaic cells, wherein, compared with a film thickness of the antireflective film in regions immediately above the photovoltaic cells, the antireflective film in boundary regions between the adjacent photovoltaic cells has a thinner film thickness and curved shape depressed towards a side to place the photovoltaic cells.

A method of manufacturing a solar cell module according to the present invention is a method of manufacturing a solar cell module having a plurality of photovoltaic cells electrically connected by connectors, comprising forming an antireflective film on a light receiving surface side of the photovoltaic cells, wherein the forming of the antireflective film includes forming an antireflective film raw material containing a glass component, an organic solvent, and silica particles on one of surfaces of a transparent member, by heating while support pins make contact with another surface of the transparent member at an interval, forming low temperature regions to partially dissipate heat from the transparent member via the support pins and high temperature regions between the low temperature regions to remove the organic solvent from the antireflective film raw material by temperature rise of the transparent member to form an antireflective precursor that is thinner in the low temperature regions than a thickness in the high temperature regions and has a curved shape depressed towards the transparent member at the thinner portion, and forming the antireflective film on the one surface of the transparent member by heat treatment of the antireflective precursor.

According to such configuration, compared with the film thickness of the antireflective film in regions immediately above the photovoltaic cells, the film thickness of the antireflective film in the boundary regions between adjacent photovoltaic cells is thin, and at the boundary regions, the antireflective film has a curved shape depressed towards the side to place the photovoltaic cells. Thus it is possible to efficiently capture incident light from the regions surrounding the region immediately above each photovoltaic cell. As a result, it is possible to achieve a highly efficient solar cell module.

In addition, by heating while support pins make contact with another surface of the transparent member at an interval, it is possible to make a film thickness of the antireflective film at boundaries between the regions immediately above the adjacent photovoltaic cells thinner than a film thickness of the antireflective film in regions immediately above the photovoltaic cells. Accordingly, it is possible to reduce costs of the masking materials and to simplify the manufacturing process, and thus to achieve cost reduction. Further, the operation of taking off the resin film or the like for masking is eliminated, so that the decrease in the adhesion between the glass and the antireflective film and the development of microcracks in the antireflective film do not occur. Thus it is possible to maintain the reliability of the photovoltaic cells over a long term.

DESCRIPTION OF THE EMBODIMENTS

Descriptions are given below to the present invention in accordance with embodiments.

Figure 1:
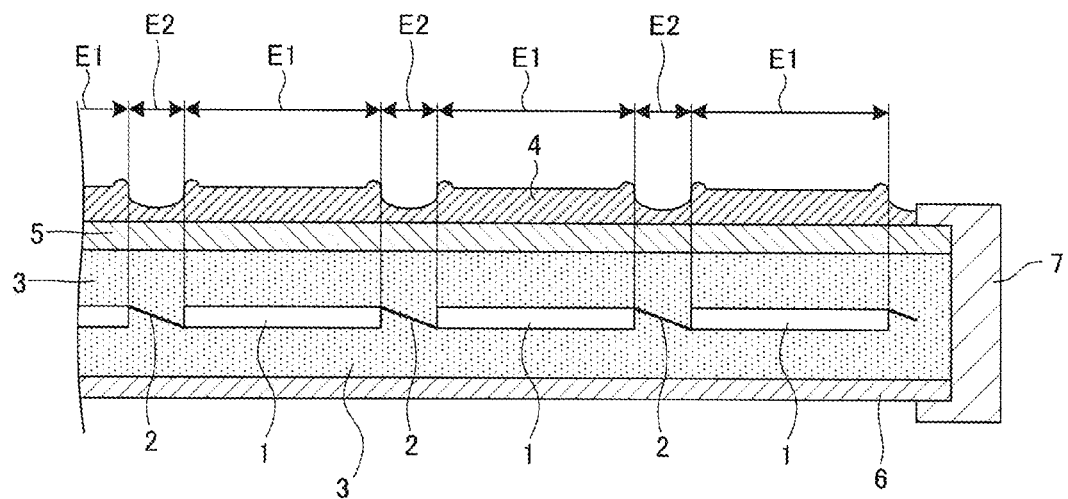
FIG. 1 is a cross-sectional structural view showing a solar cell module according to an embodiment of the present invention.

FIG. 1 shows a cross-sectional structural view of a solar cell module.

The reference numeral 1 denotes a plurality of photovoltaic cells, and these photovoltaic cells 1 are electrically connected to each other in series by that a light receiving surface electrode, not shown, of one of the adjacent photovoltaic cells 1 and a back surface electrode, not shown, of the other photovoltaic cell 1 are electrically connected by a connector 2.

On a light receiving surface side of the plurality of photovoltaic cells 1, a transparent member 5 is placed that is made of glass, plastics, and the like with an antireflective film 4 formed thereon via a transparent sealant 3, such as EVA (an ethylene vinyl acetate copolymer). On a back surface side of the photovoltaic cells 1, a back surface member 6 is placed that is made by laminating a resin, such as polyvinyl fluoride, on aluminum foil similarly via a transparent sealant 3, such as EVA. The transparent member 5 and the back surface member 6 are then integrated by a frame member 7 that is made of aluminum.

The antireflective film 4 has different film thicknesses in regions E1 immediately above the photovoltaic cells 1 and in boundary regions E2 between the regions E1 immediately above the adjacent photovoltaic cells 1. Further in detail, the antireflective film 4 in the boundary regions E2 has a curved shape depressed towards the transparent member 5 as a side to place the photovoltaic cells 1 so as to have a film thickness thinner than the film thickness of the antireflective film 4 in the regions E1 immediately above photovoltaic cells 1.

Figure 5:
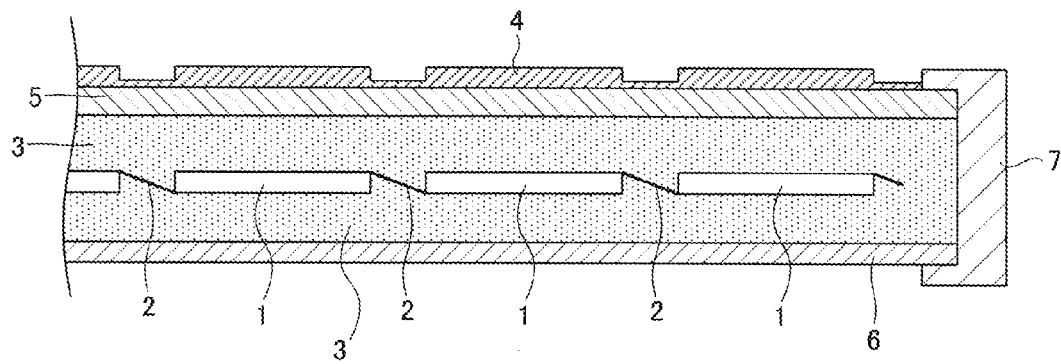
FIG. 5 is a cross-sectional view showing a conventional solar cell module in which the film thickness of the antireflective film 4 at boundaries between regions immediately above adjacent photovoltaic cells is formed thinner than that in regions immediately above the photovoltaic cells.
Figure 6:
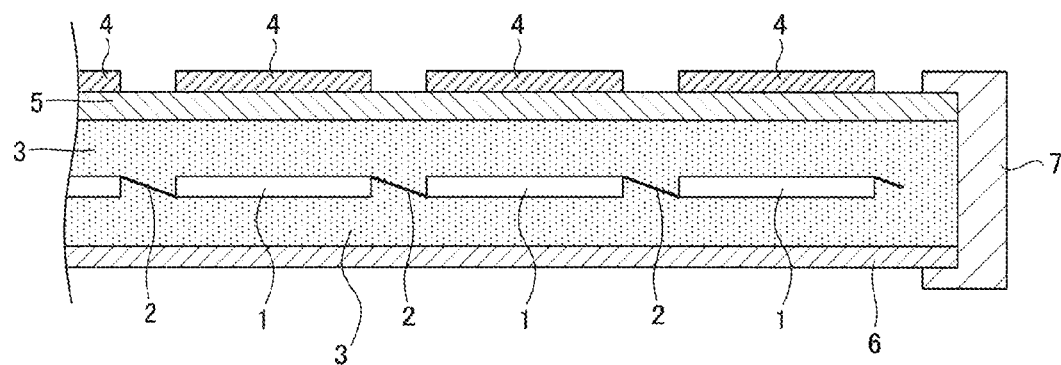
FIG. 6 is a cross-sectional view showing another conventional solar cell module in which the antireflective film 4 is not formed at boundaries between regions immediately above adjacent photovoltaic cells.

Such a shape enables to introduce incident light from the regions surrounding the region E1 immediately above each photovoltaic cell in the photovoltaic cells 1 more efficiently than with conventional photovoltaic cells 1 as shown in FIGS. 5 and 6.

It is possible to manufacture a solar cell module having the antireflective film 4 with a surface in such a special shape in a following manner.

Figure 2:
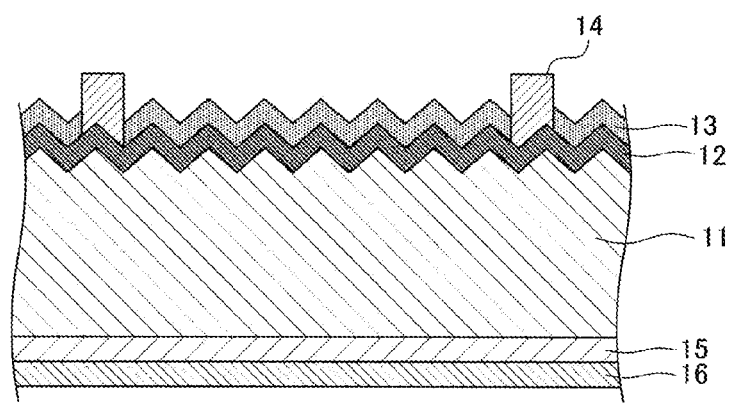
FIG. 2 is a cross-sectional structural view showing a photovoltaic cell according to the embodiment.

FIG. 2 shows a cross-sectional device structural view of the photovoltaic cell 1.

The reference numeral 11 denotes a crystalline silicon substrate having an n-type layer 12 and an antireflective film 13 laminated in this order on a light receiving surface side. The reference numeral 14 denotes a light receiving surface electrode that is made by firing on the n-type layer 12 and has its surface exposed from the antireflective film 13. The crystalline silicon substrate 11 has a highly doped p-type layer 15, in which p-type impurities are doped at a high concentration, and a back surface electrode 16 that are laminated on the back surface side.

Method of Manufacturing Photovoltaic Cell

Steps of manufacturing a photovoltaic cell are described.

Firstly, on a surface of a p-type monocrystalline silicon substrate 11 having a resistivity of 1 Ω·cm and a thickness of approximately 350 μm, a texture structure to reduce light reflection is formed using an alkaline solution. It is also possible to use a crystalline silicon substrate like a polycrystalline silicon substrate as the crystalline silicon substrate 11, and in a case of a polycrystalline silicon substrate, a texture structure is formed using an acid solution.

Next, in a region up to the depth of approximately 1 μm from a light receiving surface of the monocrystalline silicon substrate 11, P (phosphorus) is thermally diffused at a temperature of approximately 900° C. using a phosphoryl chloride (chemical formula $POCl_3$) gas to form the n-type layer 12. Instead of the $POCl_3$ gas, there is also a case of using a phosphorus glass (PSG).

Next, the antireflective film 13 made of SiNx is formed thereon by plasma CVD. After that, on the back surface of the crystalline silicon substrate 11, the back surface electrode 16 is formed by screen printing using Al paste, and brief treatment is carried out at a temperature of approximately 700° C. to thermally diffuse Al on the crystalline silicon substrate 11, thereby forming the p-type layer 15, in which Al is highly doped, as well.

To create the light receiving surface electrodes 14, Ag is made contact with a surface of the n-type layer 12 by treatment called as fire through in which finger-like Ag electrodes are printed on the antireflective film 13 made of SiNx and heat treatment is carried out to allow Ag to penetrate SiNx, which is the component of the antireflective film 13.

Method of Manufacturing Solar Cell Module

The photovoltaic cells 1 manufactured in the steps above are sandwiched by the back surface member 6 that is made by laminating polyvinyl fluoride resin on aluminum foil and the transparent member 5 with the antireflective film 4 formed thereon via the transparent sealant 3 represented by EVA. Further, these are integrated by the frame member 7 made of aluminum. By the above steps, the solar cell module shown in FIG. 1 is completed.

Here, a method of forming the transparent member 5 with the antireflective film 4 formed thereon is described.

Firstly, as shown in (a) of FIG. 3, an antireflective film raw material 4a to be varied to an antireflective film precursor 4b later is applied on the transparent member 5 so as to make the surface uniform. The antireflective film raw material 4a contains polysiloxane having a siloxane bond (—Si—O—), silica particles and an organic solvent. The polysiloxane having the siloxane bond is prepared by mixing silicon alkoxide to be a precursor in the organic solvent and then adding water and a catalyst in small quantities while stirring at ordinary temperature or under heating conditions for hydrolysis and condensation polymerization.

The organic solvent to be mixed with the silicon alkoxide is not particularly limited as long as it dissolves silicon alkoxide well. One or a plurality of types are selected from, for example, alcohols including methanol, ethanol, 1-propanol, 2-propanol, hexanol and cyclohexanol; glycols including ethylene glycol and propylene glycol; ketones including methyl ethyl ketone, diethyl ketone and methyl isobutyl ketone; terpenes including α-terpineol, β-terpineol and γ-terpineol; ethylene glycol monoalkyl ethers; ethylene glycol dialkyl ethers; diethylene glycol monoalkyl ethers; diethylene glycol dialkyl ethers; ethylene glycol monoalkyl ether acetates; ethylene glycol dialkyl ether acetates; diethylene glycol monoalkyl ether acetates; diethylene glycol dialkyl ether acetates; propylene glycol monoalkyl ethers; propylene glycol dialkyl ethers; propylene glycol monoalkyl ether acetates; propylene glycol dialkyl ether acetates; monoalkyl cellosolves; and the like. Selection of a plurality of solvent types enables to relax the drying rate and to inhibit formation of craters on the surface of the antireflective film.

The product is a solated substance of polysiloxane containing a siloxane bond. Although polysiloxane thus produced is not particularly limited in molecular weight, a higher molecular weight enables less shrinkage. In addition, it is preferred that an alkyl group is contained in the structure from the perspective of breaking the shrinkage due to the reaction and improving cracking resistance.

The material for the precursor is not particularly limited, and may be at least one or more types of precursor material selected from the group consisting of, for example, completely inorganic polysiloxane that does not contain alkyl groups, such as methyl silicate and ethyl silicate; methyltrimethoxysilane; methyltriethoxysilane; methyltriisopropoxysilane; ethyltrimethoxysilane; ethyltriethoxysilane; ethyltriisopropoxysilane; octyltrimethoxysilane; octyltriethoxysilane; vinyltrimethoxysilane; vinyltriethoxysilane; phenyltrimethoxysilane; phenyltriethoxysilane; trimethoxysilane; triethoxysilane; triisopropoxysilane; fluorotrimethoxysilane; fluorotriethoxysilane; dimethyldimethoxysilane; dimethyldiethoxysilane; diethyldimethoxysilane; diethyldiethoxysilane; dimethoxysilane; diethoxysilane; difluorodimethoxysilane; difluorodiethoxysilane; trifluoromethyl trimethoxysilane; trifluoromethyl triethoxysilane; silicon carbide (SiC); other alkoxide-based organic silicon compounds ($Si(OR)_4$); and such polyalkylsiloxane containing alkyl groups as tetra tertiary butoxysilane ($t-Si(OC_4H_9)_4$), tetra secondary butoxysilane ($sec-Si(OC_4H_9)_4$) and tetra tertiary amyloxysilane ($Si[OC(CH_9)_2C_2H_5]_4$).

While they are stirred at ordinary temperature or under heating conditions, water and a catalyst are added, thereby accelerating hydrolysis of the precursor to form silicon hydroxide. Further by condensation polymerization, a low or high molecular weight polysiloxane having the siloxane bond is formed.

The silica particles to be added preferably have a particle size of not less than 5 nm and not more than 50 nm. The particle size of not less than 5 nm enables to inhibit aggregation of the silica particles, and also the decrease in the specific surface area allows uniform and a sufficient amount of polysiloxane to exist on the particle surfaces, so that it is possible to suppress generation of cracks and to maintain the film hardness.

The particle size of not more than 50 nm enables to reduce in-plane variation in the film thickness of the antireflective film 4 in the region E1 immediately above each photovoltaic cell 1. The particles may be crystalline and may also be amorphous. Further, the particles may also be dry powdery or sol dispersed in water or an organic solvent in advance, while it is better to use those dispersed in advance for easy preparation of glass paste.

In a case of using dry powdery silica particles, a step of dispersing them in the solvent is necessary. A method of manufacturing silica particles is not particularly limited, and they may also be made dry powdery by a melting process or a combustion method and may also be manufactured by polymerization of water glass or sol-gel method. The surface condition of the silica particles is also not particularly limited. In the step of preparing a paste material by adding silica particles, the silica particles may be added before preparing the solated product having a siloxane bond and may also be added after the preparation. It should be noted, though, that the particles have to be dispersed well. The amount of the silica particles to be added is defined by a ratio to siloxane bonds finally remaining in the film. The ratio of the silica particles to the weight of the antireflective film may be from 10 weight % to 99 weight % and is desired to be preferably from 50 weight % to 99 weight %.

It is desirable that the paste material made by combining these materials has a viscosity, at a flow rate of 100 [l/s], from 1 mPa·s to 10 mPa·s approximately. The solid content concentration (a ratio of a total weight of the polysiloxane having a siloxane bond and the silica particles to a weight of the paste material) is from 1 weight % to 10 weight %, and it is desired to be preferably from 3 weight % to 8 weight %.

The antireflective film raw material 4a made by the above combination is applied on the transparent member 5 to form the antireflective film precursor 4b. It is preferable to use, for the application of the antireflective film raw material 4a, a bar-coating method or a slit-coating method.

The bar-coating method is a method of applying the paste material on a predetermined surface by discharging the paste material, followed by drawing with a wire bar. The slit-coating method is a method of applying the paste material on a predetermined surface by pressure discharging the paste material from a wide nozzle.

As another method, a spraying method may also be used although there is a concern that an ink scatters out of the necessary area as well, so that the material utilization efficiency becomes worse.

Figure 3:
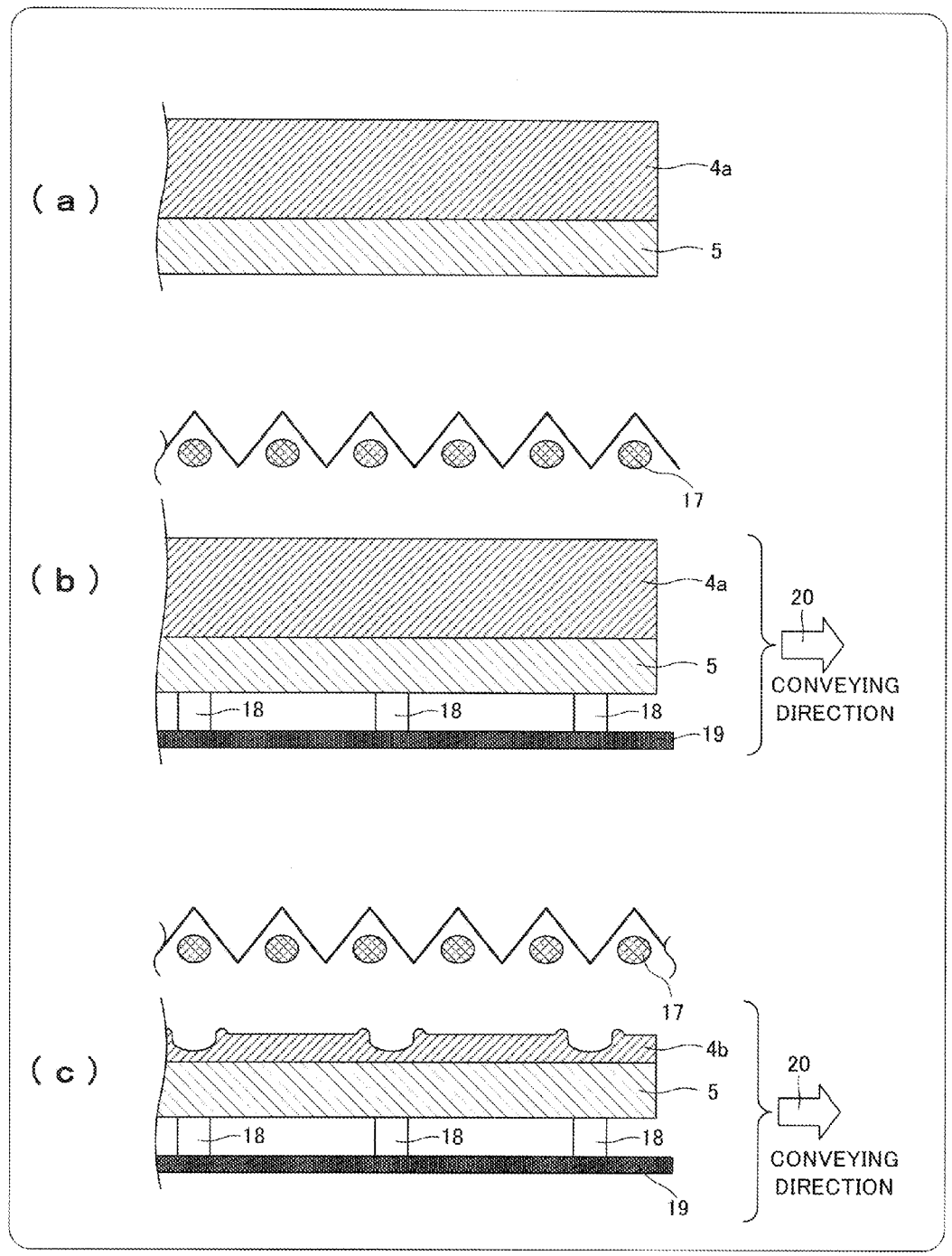
FIG. 3 shows steps of manufacturing an antireflective film according to the embodiment, where (a) shows a diagram illustrating a step of applying an antireflective film raw material on a transparent member, (b) shows a diagram illustrating a step of forming an antireflective precursor by heating the antireflective film raw material member while support pins make contact with the transparent member, and (c) shows a diagram illustrating a step of forming an antireflective film from the antireflective film precursor by heat treatment.

Next, as shown in (b) of FIG. 3, in the drying step to remove the organic solvent from the applied antireflective film raw material 4a, while support pins 18 that support the transparent member 5 make contact with places to be the boundary regions E2 between the regions E1 immediately above the adjacent photovoltaic cells 1, heating is carried out by a heat source 17 placed the side of the antireflective film raw material 4a. As the heat source 17, a halogen lamp for heat drying at 50° C. through 300° C. is preferably used. The material for the support pins 18 is preferably ceramics having a low thermal conductivity. The reference numeral 19 denotes a conveying tray with which the support pins 18 make contact and which is good in thermal conductivity and moves in a conveying direction 20. The interval between the support pins 18 corresponds to a pitch of forming the boundary regions E2.

Figure 4:
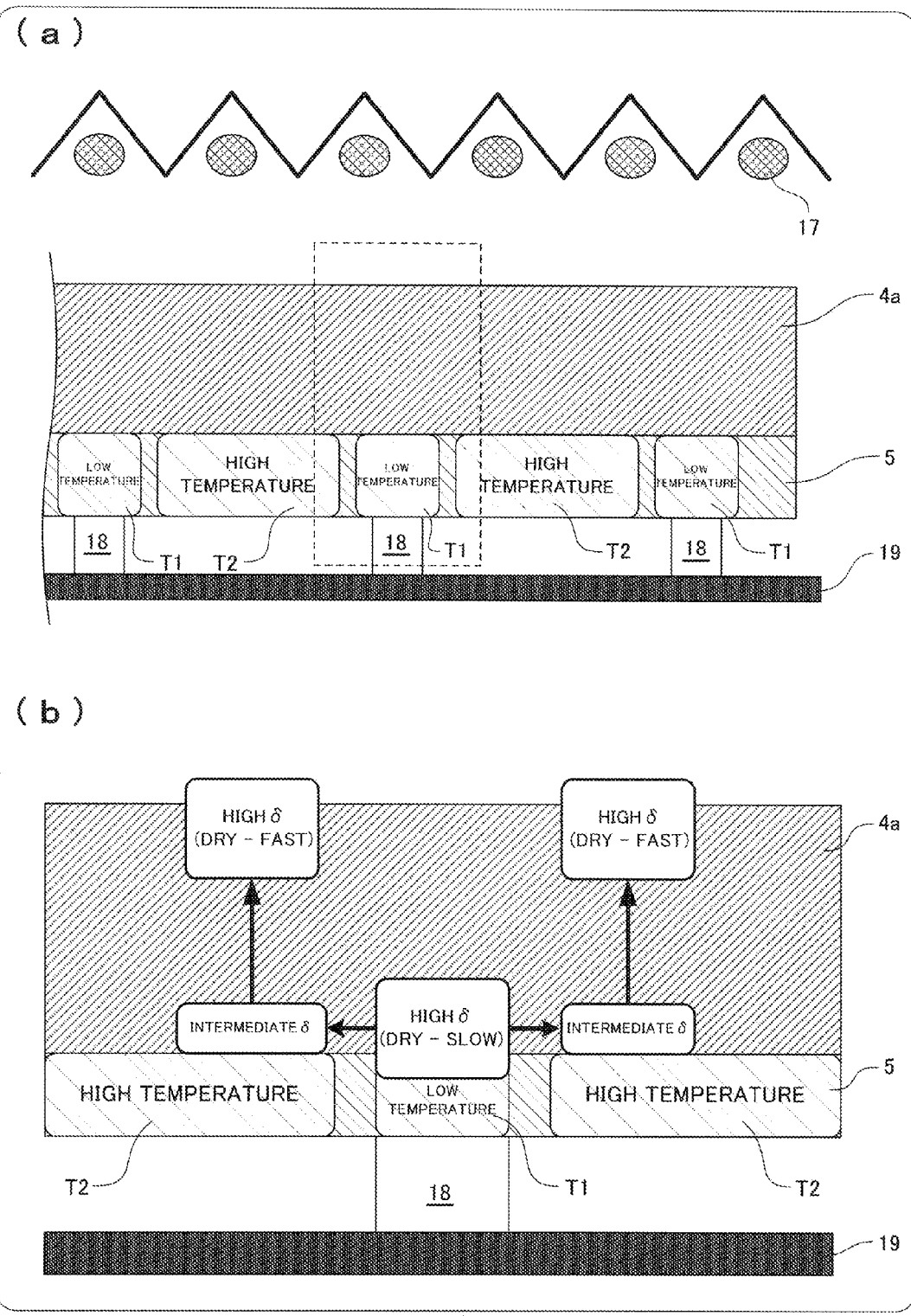
FIG. 4 is an illustrative diagram of a curved shape formation mechanism in FIG. 3 (c), where (a) shows a diagram illustrating temperature distribution of the transparent member due to the contact of the support pins and (b) shows a diagram illustrating a flow of Marangoni convection caused by a surface tension gradient generated by the temperature distribution.

As the drying step in (b) of FIG. 3 is performed, like the illustrative diagram shown in (a) of FIG. 4, regions are generated in which heat is taken away by the support pins 18 to less easily rise the temperature of the transparent member, and there is in-plane temperature distribution of the transparent member 5. That is, places of the transparent member 5 to be the boundary regions E2 between the regions E1 immediately above the respective photovoltaic cells become low temperature regions T1 as the heat is taken away by the support pins 18 in contact, and places of the transparent member 5 to be the regions E1 immediately above the respective photovoltaic cells between the support pins 18 and not making contact with the support pins 18 become high temperature regions T2.

Therefore, due to the temperature distribution and the difference in the solvent evaporation corresponding thereto, as shown in (b) of FIG. 4, the surface of the antireflective film raw material 4a above the high temperature regions T2 has high surface tension δ and fast drying rate, the bottom of the antireflective film raw material 4a on the low temperature regions T1 has high surface tension δ and slow drying rate, and the bottom of the antireflective film raw material 4a on the high temperature regions T2 has intermediate surface tension δ. Thus, gradient of surface tension δ occurs in the regions E1 immediately above the respective photovoltaic cells and the boundary regions E2 of the antireflective film raw material 4a. Hence, using the gradient of surface tension δ as the driving force, the Marangoni convection occurs from the region having lower surface tension δ to the region having higher surface tension δ, that is, from the parts to be the regions E2 to the parts to be the regions E1.

As a result, as shown in (c) of FIG. 3, the antireflective film precursor 4b of the transparent member 5 in the portions to be the boundary regions E2 of the photovoltaic cells is depressed to be curved towards the transparent member 5. Further, the antireflective film precursor 4b in the places of the transparent member 5 to be the boundary regions E2 of the photovoltaic cells has a film thickness thinner than the thickness of the antireflective film precursor 4b in the places of the transparent member 5 to be the regions E1 immediately above the photovoltaic cells.

Lastly, the antireflective film precursor 4b is further heated by the heat source 17 and unreacted siloxane is reacted for hydrolysis and condensation polymerization, thereby obtaining the antireflective film 4.

Here, the heat source 17 for heating is preferably a halogen lamp, thermal drying from 50° C. to 300° C., a plasma torch, laser, or a flash lamp. The positions and the materials of the support pins 18 after forming the antireflective film precursor 4b are not limited in particular.

The antireflective film 4 formed in the drying and firing steps above preferably has a thickness of not less than 100 nm and not more than 200 nm. The thickness of not less than 100 nm enables to inhibit evaporation of the solvent before the Marangoni convection occurs sufficiently and to form curved shape. In addition, the thickness of not more than 200 nm enables to obtain desired optical properties and also to reduce in-plane variation in the transmittance caused by in-plane variation in the film thickness.

INDUSTRIAL APPLICABILITY

The solar cell module according to the present invention is highly efficient, low in cost, and also high in long term reliability. The solar cell module is possibly used as a solar cell module for domestic and commercial use as well as for other display devices.

What is claimed is:

1. A method of manufacturing a solar cell module having a plurality of photovoltaic cells electrically connected by connectors, comprising forming an antireflective film on a light receiving surface side of the photovoltaic cells, wherein the forming of the antireflective film includes:

forming an antireflective film raw material containing a glass component, an organic solvent, and silica particles on one of surfaces of a transparent member, by heating while support pins make contact with another surface of the transparent member at an interval, forming in the transparent member low temperature regions to partially dissipate heat from the transparent member via the support pins and high temperature regions between the low temperature regions to remove the organic solvent from the antireflective film raw material by temperature rise of the transparent member to form an antireflective precursor that is thinner in the low temperature regions than a thickness in the high temperature regions and has a curved shape depressed towards the transparent member at the thinner portion, and forming the antireflective film on the one surface of the transparent member by heat treatment of the antireflective precursor.

2. The method of manufacturing a solar cell module according to claim 1, wherein the interval between the support pins corresponds to a pitch of forming the boundary regions formed between the adjacent photovoltaic cells.

* * * * *